US008516334B2

(12) United States Patent
Xu et al.

(10) Patent No.: US 8,516,334 B2
(45) Date of Patent: Aug. 20, 2013

(54) CHANNEL CODING, MODULATING AND MAPPING METHOD FOR HYBRID AUTOMATIC REPEAT REQUEST OF LOW DENSITY PARITY CHECK CODE

(75) Inventors: Jun Xu, Shenzhen (CN); Zhifeng Yuan, Shenzhen (CN); Liujun Hu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 417 days.

(21) Appl. No.: 12/663,050

(22) PCT Filed: Feb. 28, 2008

(86) PCT No.: PCT/CN2008/000408
§ 371 (c)(1),
(2), (4) Date: Dec. 4, 2009

(87) PCT Pub. No.: WO2008/151498
PCT Pub. Date: Dec. 18, 2008

(65) Prior Publication Data
US 2011/0239075 A1    Sep. 29, 2011

(30) Foreign Application Priority Data
Jun. 12, 2007   (CN) .......................... 2007 1 0126103

(51) Int. Cl.
*H03M 13/00*   (2006.01)
(52) U.S. Cl.
USPC ......................................................... 714/758
(58) Field of Classification Search
USPC ......................................................... 714/758
See application file for complete search history.

(56) References Cited

U.S. PATENT DOCUMENTS

| 6,405,338 | B1 * | 6/2002 | Sinha et al. | 714/752 |
|---|---|---|---|---|
| 7,000,174 | B2 * | 2/2006 | Mantha et al. | 714/790 |
| 7,110,470 | B2 * | 9/2006 | Von Elbwart et al. | 375/298 |
| 7,421,644 | B2 * | 9/2008 | Mantha et al. | 714/800 |
| 8,020,065 | B1 * | 9/2011 | Gaur | 714/755 |
| 8,140,950 | B2 * | 3/2012 | Mantha et al. | 714/800 |
| 8,219,875 | B2 * | 7/2012 | Gaur | 714/755 |
| 2003/0126551 | A1 * | 7/2003 | Mantha et al. | 714/790 |
| 2005/0149841 | A1 | 7/2005 | Kyung et al. | |
| 2006/0107192 | A1 * | 5/2006 | Mantha et al. | 714/800 |
| 2007/0113147 | A1 | 5/2007 | Hong et al. | |
| 2008/0282127 | A1 * | 11/2008 | Mantha et al. | 714/751 |

(Continued)

FOREIGN PATENT DOCUMENTS

| CN | 1335722 A | 2/2002 |
|---|---|---|
| CN | 1953335 A | 4/2007 |
| CN | 1960358 A | 5/2007 |
| CN | 101005334 A | 7/2007 |

*Primary Examiner* — Amine Riad
(74) *Attorney, Agent, or Firm* — McClure, Qualey & Rodack, LLP

(57) ABSTRACT

The present invention discloses a method for channel coding and modulation mapping in HARQ of the LDPC code, comprising: performing structured LDPC encoding of an information bit sequence with a length of K input by a channel encoder, and sending a generated codeword to a HARQ buffer; rearranging codeword bits of a LDPC HARQ mother code in the HARQ buffer, and sequentially selecting codeword bits to generate a binary sequence of a HARQ packet; mapping codeword bits of the HARQ packet to a constellation, and high-significant bits in encoding blocks of the HARQ packet being mapped to high reliability bits in the constellation. The present invention provides the LDPC codeword with the maximal constellation gain, so that the LDPC HARQ channel encoding has the optimal performance.

8 Claims, 3 Drawing Sheets

(56) References Cited

U.S. PATENT DOCUMENTS

| | | | |
|---|---|---|---|
| 2010/0014601 A1* | 1/2010 | Mo et al. | 375/260 |
| 2010/0100789 A1* | 4/2010 | Yu et al. | 714/752 |
| 2010/0303167 A1* | 12/2010 | Juang et al. | 375/267 |
| 2011/0081902 A1* | 4/2011 | Seo et al. | 455/423 |
| 2011/0150109 A1* | 6/2011 | Huang et al. | 375/260 |
| 2011/0239075 A1* | 9/2011 | Xu et al. | 714/751 |
| 2011/0274043 A1* | 11/2011 | Nam et al. | 370/328 |
| 2012/0099570 A1* | 4/2012 | Kobayashi et al. | 370/338 |

* cited by examiner

CHANNEL CODING, MODULATING AND MAPPING METHOD FOR HYBRID AUTOMATIC REPEAT REQUEST OF LOW DENSITY PARITY CHECK CODE

CROSS REFERENCE RELATED APPLICATIONS

This application is a national phase of PCT/CN2008/000408 filed Feb. 28, 2008, which claims priority to China Application Serial No.200710126103.2, filed Jun. 12, 2007, both of which are entirely incorporated herein by reference.

TECHNICAL FIELD

The present invention relates to hybrid automatic repeat request (HARQ) of the low density parity check (LDPC) code, and more specifically, to a method for the channel encoding and modulation mapping therein.

BACKGROUND OF THE INVENTION

All digital communication systems need channel encoders, as shown in FIG. 1. The channel coder is used to resist various noises and interferences during a transmission process, by manually adding redundant information so that the system is capable of automatic error correction, and thereby reliability of digital transmission can be guaranteed. The low density parity check (LDPC) code is a type of linear block code that can be defined by a very sparse parity check matrix or bipartite graph, and since it is initially discovered by Gallager, it is referred to as Gallager code. Over decades of silence, with the development of computer hardware and relevant theories, MacKay and Neal rediscovered it and proved that it has a property of approximating to the Shannon limit. Latest research shows that the low density parity check code has characteristics of low decoding complexity, capability of linear-time encoding, having a property of approximating to the Shannon limit, capability of parallel decoding, and having a performance better than that of Turbo code in the case of a long code length.

The LDPC code is a linear block code based on a sparse check matrix, and utilizing the sparseness of its check matrix, low complexity encoding and decoding can be implemented, so that the LDPC code becomes practical. The Gallager code mentioned previously is a regular LDPCC, while Luby and Mitzenmacher et al extended the Gallager code and proposed an irregular LDPCC. The LDPC code has plenty of decoding algorithms, wherein, the Message Passing algorithm or the Belief Propagation algorithm (BP algorithm) is a mainstream and basic algorithm of the LDPC code, and so far a lot of improved effective decoding algorithms have emerged.

The graphical form of a LDPC parity check matrix is a bipartite graph. There is a one-to-one correspondence between the bipartite graph and the check matrix, and an M*N parity check matrix H defines a constraint that each codeword of N bits satisfies M parity check sets. A bipartite graph comprises N variable nodes and M parity check nodes. If the $m^{th}$ check relates to the $n^{th}$ bit, that is, for the element Hm at the $m^{th}$ row and $n^{th}$ column in H, n=1, there will be a line connecting the check node m and the variable node n. In a bipartite graph, there will be no connection between any nodes of the same type, and the total number of sides in the bipartite graph is equal to the number of non-zero elements in the check matrix.

A special type of LDPC code gradually becomes a mainstream application due to its structured characteristics. Supposing the parity check matrix H of this type of LDPC code is a (M×z)×(N×z) matrix consisting of M×N block matrices, each of which is a different power of a z×z basic permutation matrix, and if the basic permutation matrix is an identity matrix, the block matrices are all cyclic shift matrices of the identity matrix (right shift by default in this disclosure). It has a form as follows:

If the power $h_{ij}^b = -1$, then $P^{h_{ij}^b} = 0$. If $h_{ij}^b$ is an integer no less than 0, it is defined $$H = \begin{bmatrix} 1 & 0 & 0 & | & 0 & 1 & 0 & | & 1 & 0 & 0 & | & 0 & 0 & 0 \\ 0 & 1 & 0 & | & 0 & 0 & 1 & | & 0 & 1 & 0 & | & 0 & 0 & 0 \\ 0 & 0 & 1 & | & 1 & 0 & 0 & | & 0 & 0 & 1 & | & 0 & 0 & 0 \\ 0 & 0 & 1 & | & 0 & 1 & 0 & | & 0 & 0 & 1 & | & 0 & 1 & 0 \\ 1 & 0 & 0 & | & 0 & 0 & 1 & | & 1 & 0 & 0 & | & 0 & 0 & 1 \\ 0 & 1 & 0 & | & 1 & 0 & 0 & | & 0 & 1 & 0 & | & 1 & 0 & 0 \end{bmatrix}$$

$P^{h_{ij}^b} = (P)^{h_{ij}^b}$, herein P is a standard z×z permutation matrix shown as follows:

$$P = \begin{bmatrix} 0 & 1 & 0 & \cdots & 0 \\ 0 & 0 & 1 & \cdots & 0 \\ \cdots & \cdots & \cdots & \cdots & \cdots \\ 0 & 0 & 0 & \cdots & 1 \\ 1 & 0 & 0 & \cdots & 0 \end{bmatrix}$$

With such a power $h_{ij}^b$, each block matrix can be uniquely identified, and the power of the identity matrix can be represented by 0, and a zero matrix is generally represented by −1. As such, if each block matrix of H is replaced with its power, a $m_b \times n_b$ power matrix $H_b$ can be acquired. Here, $H_b$ is defined as the base matrix of H, and H is referred to as the expanded matrix of $H_b$. In practical encoding, z=code length/the number of columns nb of the base matrix is referred to as the expand factor.

$$H = \begin{bmatrix} P^{h_{00}^b} & P^{h_{01}^b} & P^{h_{02}^b} & \cdots & P^{h_{0n_b}^b} \\ P^{h_{10}^b} & P^{h_{11}^b} & P^{h_{12}^b} & \cdots & P^{h_{1n_b}^b} \\ \cdots & \cdots & \cdots & \cdots & \cdots \\ P^{h_{m_b0}^b} & P^{h_{m_b1}^b} & P^{h_{m_b2}^b} & \cdots & P^{h_{m_bn_b}^b} \end{bmatrix} = P^{H_b}$$

For example, the matrix H can be acquired by expanding a 2×4 base matrix $H_b$ with the following parameter z:

$$z = 3 \text{ and } H_b = \begin{bmatrix} 0 & 1 & 0 & -1 \\ 2 & 1 & 2 & 1 \end{bmatrix}$$

Therefore, it can also be said that the LDPC code encoder of the present invention is uniquely generated by a base matrix $H_b$, an expand factor z and a selected basic permutation matrix.

If a base matrix is utilized for each LDPC code with a different expand factor, then for each different code length, said LDPC code encoder needs to store a base matrix, and if there are plenty of code lengths, plenty of basic matrices have to be stored, which will bring problems of representation and storage. Therefore, if it is needed to implement a variable code length, LDPC codes with different code lengths within a certain range and the same code rate will use a uniform base matrix which we define as a uniform base matrix $H_b^{uniform}$. If a code length is different, a parity check matrix H can be obtained by modifying and extending the $H_b^{uniform}$, and as a result, the generated codec can apply to a variable code length.

The modification is a modification of the non-negative values in the base matrix $H_b$ utilizing an expand factor with a different code length, and the value of the modified element should be less than the value of the expand factor with the code length. There are a lot of modification algorithms, for example, mod, scale+floor, scale+round or the like can be utilized. Supposing $P_{ij}$ is a non-negative element of 1 at the $i^{th}$ row and $j^{th}$ column of the base matrix $N_b$, $P_{ij}'$ is a non-negative element of 1 at the $i^{th}$ row and $j^{th}$ column of the modified matrix $H_b^{modified}$, then:

With the mod method, $$P_{ij}' \equiv P_{ij} \bmod z \equiv P_{ij} \bmod \frac{N}{n_b}$$

With the scale+floor method, $$P_{ij}' = \left\lfloor P_{ij} \times \frac{z}{z_{max}} \right\rfloor = \left\lfloor P_{ij} \times \frac{N}{N_{max}} \right\rfloor$$

With the scale+round method:

$$P_{ij}' = \text{Round}\left(P_{ij} \times \frac{z}{z_{max}}\right) = \text{Round}\left(P_{ij} \times \frac{N}{N_{max}}\right)$$

Wherein, z is the expand factor corresponding to the current code length, i.e. the number of rows or columns of the block matrix; $z_{max}$ is the expand factor corresponding to the maximum code length supported. mod is a modulus operation, $\lfloor \ \rfloor$ is a flooring operation and Round is a rounding operation.

In IEEE802.16e, the LDPC code supports code rates of ½, ⅔, ¾ and ⅚, so there are four base matrices, and it becomes difficult to use a unique encoder/decoder to implement encoding and decoding with different code rates; if the four code rates need four codec, hardware cost will become an application bottleneck. But this type of LDPC code with a specific code rate and variable code length has a uniform base matrix, and only one encoder/decoder needs to be used. Wherein, the encoding method and encoder can be acquired with reference to a Chinese patent application of which the application number is 200710072808.0 and the patent name is "an apparatus and method for encoding the LDPC code supporting incremental redundancy HARQ".

HARQ is an extremely important link adaptation technology in a wireless communication system.

The HARQ method will be briefly described below. The method comprises two parts: a transmission method of a transmitter and a reception method of a receiver, and the method should be universal.

The transmission method of the transmitter comprises:

a. The transmitter sends the first HARQ packet in a specified HARQ channel, a new HARQ transmission starts, and the retransmission counter is set to 1;

b. The transmitter waits for an ACK/NAK sent by the receiver;

c. After a certain delay (depending on whether it is synchronous mode or asynchronous mode, the delay is decided by the system), if the transmitter receives the ACK, then the packet is correctly received and this HARQ transmission ends; otherwise, the retransmission counter is added by 1, and whether the number of retransmissions exceeds the maximum number of retransmissions permitted is determined, if yes, then this HARQ transmission ends, otherwise, proceeds to d;

d. The transmitter tries another HARQ in the HARQ channel of this HARQ transmission, the sending time can be selected by the system, and returns to b.

The reception method of the receiver comprises:

a. Receive a HARQ packet, and determine whether the received packet is the first HARQ attempt, if yes, proceed to b; otherwise proceed to d;

b. Discard all the HARQ attempts previously received in this HARQ channel;

c. Decode the packet, and proceed to e;

d. The decoder of the receiver combines the originally error and retransmitted encoding packets according to a specific combination method;

e. If the decoding is correct, then after a certain delay, send the ACK in a feedback channel which is allocated by the system; otherwise, send the NAK and store the HARQ packet.

In the step d of the above reception method, the combination method may comprise full incremental redundancy, partial incremental redundancy and Chase combination.

How to support the HARQ based on the LDPC code supporting any code length and any code rate and make the LDPC HARQ channel encoding have the optimal performance is a problem to be researched and solved at present.

SUMMARY OF THE INVENTION

The technical problem to be solved by the present invention is to provide a method for channel encoding and modulation mapping in hybrid automatic repeat request of the low density parity check code, so as to provide the LDPC codeword with the maximal constellation gain, so that the LDPC HARQ channel encoding has the optimal performance.

In order to solve the above technical problem, the present invention provides a method for channel coding and modulation mapping in hybrid automatic repeat request of a low density parity check code, comprising the following steps of:

(a) performing structured low density parity check encoding of an information bit sequence with a length of K input by a channel encoder, and sending a generated codeword to a hybrid automatic repeat request buffer;

(b) rearranging codeword bits of a low density parity check hybrid automatic repeat request mother code in the hybrid automatic repeat request buffer, and sequentially selecting codeword bits to generate a binary sequence of a hybrid automatic repeat request packet;

(c) mapping codeword bits of the hybrid automatic repeat request packet to a constellation, and high-order bits in encoding blocks of the hybrid automatic repeat request packet being mapped to high reliability bits in the constellation.

Furthermore, said step (a) further divides into the following sub-steps of:

(a1) determining a mother code set of low density parity check codes, said mother code set consisting of a finite number of low density parity check codes with different code lengths and the same code rate $R_0$, and said mother code set having a uniform base matrix $H_b^{uniform}$ with a size of $m_b \times n_b$, and $k_b = n_b - m_b$;

(a2) determining an expand factor $z_k$ according to a matching information group length, and determining parameters and a matrix required by an encoder according to the expand factor and the base matrix $H_b^{uniform}$;

(a3) according to the parameters and matrix required for encoding, the encoder encoding the input K bit information group, and generating and outputting an $N_{FIR}$ bit codeword.

Furthermore, the uniform base matrix $H_b^{uniform}$ of the mother code set with the code rate $R_0 = \frac{1}{2}$ utilized in said step (a1) is as follows:

$$H_b^{uniform} = \begin{bmatrix}
605 & 173 & 110 & -1 & 274 & -1 & -1 & -1 & -1 & -1 & -1 & -1 & -1 & 108 & -1 & -1 & -1 & 0 & -1 & -1 & -1 & -1 & -1 & -1 \\
194 & 77 & 265 & 571 & -1 & -1 & -1 & -1 & 242 & -1 & -1 & -1 & 246 & -1 & -1 & -1 & 0 & 0 & -1 & -1 & -1 & -1 & -1 & -1 \\
63 & 0 & 538 & -1 & -1 & 194 & -1 & -1 & -1 & 358 & -1 & -1 & -1 & 411 & -1 & -1 & -1 & 0 & 0 & -1 & -1 & -1 & -1 & -1 \\
23 & 271 & 260 & 166 & -1 & -1 & -1 & -1 & 348 & -1 & 566 & -1 & -1 & -1 & -1 & -1 & -1 & -1 & 0 & 0 & -1 & -1 & -1 & -1 \\
238 & 241 & 574 & -1 & 466 & -1 & -1 & -1 & -1 & 111 & -1 & -1 & -1 & -1 & -1 & -1 & -1 & -1 & -1 & 0 & 0 & -1 & -1 & -1 \\
601 & 442 & 474 & 218 & -1 & -1 & -1 & 321 & -1 & -1 & 446 & -1 & -1 & -1 & -1 & -1 & -1 & -1 & -1 & -1 & 0 & 0 & -1 & -1 \\
56 & 148 & 618 & -1 & 363 & -1 & 485 & -1 & -1 & -1 & 454 & -1 & -1 & -1 & -1 & -1 & -1 & -1 & -1 & -1 & -1 & 0 & 0 & -1 \\
495 & 178 & 459 & 270 & -1 & -1 & -1 & -1 & 112 & -1 & -1 & 193 & -1 & -1 & -1 & -1 & -1 & -1 & -1 & -1 & -1 & -1 & 0 & 0 \\
611 & 380 & 170 & -1 & -1 & -1 & 241 & 346 & -1 & -1 & -1 & -1 & 135 & -1 & -1 & -1 & -1 & -1 & -1 & -1 & -1 & -1 & -1 & 0 \\
343 & 255 & 353 & 405 & 317 & -1 & -1 & -1 & 436 & -1 & -1 & -1 & -1 & 501 & -1 & -1 & 0 & -1 & -1 & -1 & -1 & -1 & -1 & -1 \\
630 & 42 & 282 & -1 & -1 & -1 & 436 & -1 & -1 & 552 & -1 & -1 & 96 & -1 & 12 & -1 & -1 & -1 & -1 & -1 & -1 & -1 & -1 & -1 \\
194 & 479 & 621 & 170 & -1 & -1 & -1 & 436 & -1 & -1 & -1 & -1 & -1 & -1 & -1 & 567 & -1 & -1 & -1 & -1 & -1 & -1 & -1 & -1 \\
352 & 158 & 73 & -1 & -1 & -1 & 471 & 187 & -1 & -1 & -1 & -1 & -1 & -1 & 218 & -1 & -1 & -1 & -1 & -1 & -1 & -1 & -1 & -1 \\
524 & 595 & 329 & 185 & -1 & 532 & -1 & -1 & -1 & -1 & -1 & -1 & -1 & -1 & -1 & -1 & 501 & 536 & -1 & -1 & -1 & -1 & -1 & -1 \\
573 & 48 & 108 & -1 & 452 & -1 & -1 & -1 & -1 & 195 & -1 & -1 & -1 & -1 & -1 & -1 & -1 & -1 & 0 & -1 & -1 & -1 & -1 & -1 \\
293 & 5 & 409 & 9 & -1 & -1 & -1 & -1 & 285 & -1 & -552 & -1 & -1 & -1 & -1 & -1 & -1 & -1 & -1 & -1 & -1 & -1 & -1 & 0
\end{bmatrix}$$

Furthermore, if a code rate r to be utilized in the encoding is less than $R_0$, said step (a2) divides into the following sub-steps of:

a2A1) utilizing $$\Delta m = \left\lceil \frac{k_b}{r} - n_b \right\rceil$$

to determine $\Delta m$, adding $\Delta m$ rows and $\Delta m$ columns respectively after the last row and last column of the base matrix $H_b^{uniform}$ to extend the base matrix $H_b^{uniform}$ into a $(m_b+\Delta m) \times (n_b+\Delta m)$ extended base matrix $H_b^{uniform\_extension}$, the extended base matrix consisting of a system bits part, that is, an information bits part, a punctured check bits part and an extended check bits part, and $\lceil \ \rceil$ representing ceiling;

a2A2) utilizing an expand factor formula $$z_t = \frac{K}{k_b}$$

to determine an expand factor $z_t$, supposing $z_t$ having a relationship of $z_{k-1} < z_t \leq z_k$ with elements in an Zset, wherein $z_{k-1}$, $z_k$ are two adjacent elements in values in the Zset, then the expand factor required by the encoder being $z_k$;

a2A3) based on the extended uniform base matrix $H_b^{uniform\_extension}$ and the expand factor $z_k$, modifying the $H_b^{uniform\_extension}$ according to a preset modification algorithm, and calculating a modified extension base matrix $H_b^{modified\_extension}$ with a size of $(N=(n_b+\Delta m) \times z_k, K=k_b \times z_k)$ required for the low density parity check encoding, the modified extension base matrix being the matrix required for the encoding, and parameters of the expand factor and the matrix size being the parameters required for the encoding;

if the code rate r to be utilized in the encoding is no less than $R_0$, the following sub-steps are performed in step (a2):

a2B1) utilizing an expand factor formula $$z_t = \frac{K}{k_b}$$

to determine an expand factor $z_t$, supposing $z_t$ having a relationship of $z_{k-1} < z_t \leq z_k$ with elements in an Zset, wherein $z_{k-1}$, $z_k$ are two adjacent elements in values in the Zset, then the expand factor required by the encoder being $z_k$;

a2B2) based on the uniform base matrix $H_b^{uniform}$ and the expand factor $z_k$, calculating a modified base matrix with a matrix size of $(m_b \times z_k, n_b \times z_k)$ required for the encoding according to a preset modification algorithm and the expand factor, the modified base matrix being the matrix required for the encoding, and parameters of the expand factor and the matrix size being the parameters required for the encoding;

Furthermore, a particular extension method in step a2A1) is as follows:

for a row index $i=m_b+1$ in the newly-added matrix part in $H_b^{uniform\_extension}$, there are always:

$H_b^{uniform\_extension}(i,i-m_b)=0$ $H_b^{uniform\_extension}(i,i-m_b+1)=0$ $H_b^{uniform\_extension}(i,i-m_b+n_b)=0$ for any row index i satisfying $m_b+2 \leq i \leq m_b+\Delta m$, there are:

$H_b^{uniform\_extension}(i,i-m_b+1)=0$ $H_b^{uniform\_extension}(i,i-m_b+n_b-1)=0$ $H_b^{uniform\_extension}(i,i-m_b+n_b)=0$ other elements in the newly-added matrix part is −1.

Furthermore, step (a3) further divides into the following steps of:

a31) adding $x=k_b \cdot z_k - K$ zero bits before the K information bits to form a $k_b \cdot z_k$ information group required for the encoding; and then performing $(N=(n_b+\Delta m) \times z_k, K=k_b \times z_k)$ low density parity check encoding to form $(n_b+\Delta m) \times z_k$ encoding codeword bits;

a32) from said encoding codeword, deleting the x zero bits added, and if the number of codeword bits after the deletion does not match the group size $N_{FIR}$ required, then continuing to delete $y=(m_b+\Delta m) \times z_k - N_{FIR}+K$ bits from the codeword after deleting the zero bits, to form a encoding codeword with the length of $N_{FIR}$.

Furthermore, in step a32), said $N_{FIR}$ has the following definition:

$$N_{FIR} = \begin{cases} N_{BUF} & N_{max} \geq N_{BUF} \\ N_{max} & N_{max} < N_{BUF} \end{cases}$$

herein, $N_{max}=K+n_b \cdot \lceil K/k_b \rceil$; $N_{BUF}$ is the maximum value of received soft bit information that can be stored in a virtual buffer, and the value is determined by an upper-level signaling in each HARQ transmission.

Furthermore, the method further comprises:

when the codeword bits of the low density parity check hybrid automatic repeat request mother code in the hybrid automatic repeat request buffer is rearranged in step (b), rearranging the codeword bits of the low density parity check hybrid automatic repeat request mother code in the hybrid automatic repeat request buffer, while maintaining sequences of the information bits and extended check bits unchanged, and changing a sequence of the punctured check bits, that is, letting codeword bits before arrangement be $A_0, A_1, \ldots, A_{N_{FIR}-1}$ and codeword bits after arrangement be $B_0, B_1, \ldots, B_{N_{FIR}-1}$, then a formula for the arrangement being defined as:

$$B_k = \begin{cases} A_k & k < K \text{ and } k \geq n_b \cdot z_k - x \\ A_{(k+x)modz_k+PV(\lfloor (k+x)/z_k \rfloor - k_b) \times z_k} & k \text{ is any other value} \end{cases}$$

wherein $\lfloor \ \rfloor$ represents flooring, $k=0,1,\ldots,N_{FIR}-1$, PV is a punctured pattern vector comprising $m_b$ elements and consisting of integers from $k_b$ to $n_b-1$, and PV(l) is an index of the punctured vector PV and has l elements;

by deforming the above formula, the arrangement formula having a equivalent form as follows:

$$B_k = \begin{cases} A_k & k < K, \text{ or } k \geq K + m_b \times z \\ A_{(k-K)modz+PV(\lfloor (k-K)/z \rfloor - k_b) \times z + K} & \text{else} \end{cases}$$

Furthermore, the method further comprises:

when codeword bits are sequentially selected from the codeword of the rearranged hybrid automatic repeat request mother code in step (b), starting from a first system bit in a first transmission, a starting position of each transmission afterwards following an ending position of a previous transmission, so that a binary sequence of a hybrid automatic repeat request packet is generated, and a formula being:

$$C_{k,i} = B_{(L_{total}(k-1)+i) \bmod (N_{FIR})}$$

Wherein k represents an index of hybrid automatic repeat request sub-packets, when hybrid automatic repeat request is applied, k=0 represents the first transmission, and the index of a sub-packet transmitted subsequently is incremented by one, and so forth, when hybrid automatic repeat request is not applied, k=0; $L_k$ represents a length of a $k^{th}$ sub-packet, $$L_{total}(k) = \sum_{j=0}^{k-1} L_j$$

and $L_{total}(-1)$ is supposed to be zero, $C_{k,0}, C_{k,1}, \ldots, C_{k,L_k-1}$ are codeword bits of the $k^{th}$ sub-packet, and $B_0, B_1, \ldots, B_{N_{FIR}-1}$ is the codeword of the hybrid automatic repeat request mother code.

Furthermore, the method further comprises:
when the codeword bits of the hybrid automatic repeat request packet are mapped to the constellation in step (c), firstly performing interleaving, and then performing mapping, and step (c) comprising the following steps of:

(c1) utilizing an interleaver to interleave the codeword bits of the hybrid automatic repeat request packet, reading in by rows and reading out by columns, and guaranteeing that the high-order bits in the encoding blocks of the hybrid automatic repeat request packet are mapped to high reliability bits in the constellation;

(c2) sequentially mapping said codeword bits to the constellation, and for binary phase shift keying, quadrature phase shift keying, 8 phase shift keying, 16 quadrature amplitude modulation, or 64 quadrature amplitude modulation, modulating a group of input bits $b_{m-1}, \ldots, b_0$ into a complex symbol.

Furthermore, in said step (c1), an $N_{cpc} \times L$ row-column interleaver is utilized, and for quadrature phase shift keying, 8 phase shift keying, 16 quadrature amplitude modulation and 64 quadrature amplitude modulation, $N_{cpc}$ is respectively 2, 6, 4 and 6; $L = 2N_{cbps}/N_{cpc}$, wherein an interleaving length $N_{cbps}$ is equal to a length $L_k$ of a $k^{th}$ hybrid automatic repeat request packet, and the interleaving is represented by the following arrangement formula:
codeword bits before arrangement are $C_0, C_1, \ldots, C_{N_{cbps}-1}$,
codeword bits after arrangement are $D_0, D_1, \ldots, D_{N_{cbps}-1}$,
the formula is defined as:

$$D_k = C_{(N_{cpc}/2) \cdot k \bmod L + \lfloor k/L \rfloor} \quad L = 2N_{cbps}/N_{cpc}, k=0,1,\ldots,N_{cbps}-1$$

in said step (c2), each m=log 2(M) bits of said codeword bits $D_0, D_1, \ldots, D_{N_{cbps}-1}$ starting from zero form a group and are mapped to a modulation symbol, and M represents a modulation order.

Furthermore, step (c) comprises the following steps:
letting the encoded bit sequence before modulation be $D_0, D_1, \ldots, D_{N_{cbps}-1}$, and a complex symbol sequence after modulation be $S_0, S_1, \ldots, S_{N_{sym}-1}$, a $k^{th}$ symbol $S_k$ corresponding to a binary sequence $(b_{m-1,k}, \ldots, b_{0,k})$, and $S_k$ comprising a real part $S_k^I$ and an imaginary part $S_k^Q$, modulation orders for quadrature phase shift keying, 8 phase shift keying, 16 quadrature amplitude modulation and 64 quadrature amplitude modulation being respectively 2, 3, 4 and 6, then the input binary data $D_0, D_1, \ldots, D_{N_{cbps}-1}$ for modulation being mapped to the constellation according to the following formulas:

if the modulation is quadrature phase shift keying:

$$(b_{1,k}, b_{0,k}) = (D_{2k}, D_{2k+1}) \quad k=0,1,\ldots,N_{cbps}/2-1$$

if the modulation is 8 phase shift keying:

$$(b_{2,k}, b_{1,k}, b_{0,k}) = (D_k, D_{k+N_{cbps}/3}, D_{k+2 \cdot N_{cbps}/3}) \quad k=0,1,\ldots N_{cbps}/3-1$$

if the modulation is 16 quadrature amplitude modulation:

$$(b_{3,k}, b_{2,k}, b_{1,k}, b_{0,k}) = (D_k, D_{k+N_{cbps}/4}, D_{k+N_{cbps}/2}, D_{k+3 \cdot N_{cbps}/4}) \quad k=0,1,\ldots N_{cbps}/4-1$$

if the modulation is 64 quadrature amplitude modulation:

$$(b_{5,k}, b_{4,k}, b_{3,k}, b_{2,k}, b_{1,k}, b_{0,k}) = (D_k, D_{k+N_{cbps}/6}, D_{k+N_{cbps}/3}, D_{k+N_{cbps}/2}, D_{k+2 \cdot N_{cbps}/3}, D_{k+5 \cdot N_{cbps}/6}). \quad k=0,1,\ldots, N_{cbps}/6-1$$

Another problem to be solved by the present invention is to provide a method for modulation mapping in hybrid automatic repeat request of the low density parity check code, which can provide the LDPC codeword acquired by structured LDPC encoding with the maximal constellation gain.

In order to solve the above technical problem, the present invention provides a method for modulation mapping in hybrid automatic repeat request of a low density parity check code, comprising:

(c1) utilizing an interleaver to interleave codeword bits in an hybrid automatic repeat request packet acquired through structured low density parity check encoding, reading in by rows and reading out by columns, and guaranteeing that high-order bits in encoding blocks of the hybrid automatic repeat request packet are mapped to high reliability bits in a constellation;

(c2) sequentially mapping said codeword bits to the constellation, and for binary phase shift keying, quadrature phase shift keying, 8 phase shift keying, 16 quadrature amplitude modulation, or 64 quadrature amplitude modulation, modulating a group of input bits $b_{m-1}, \ldots, b_0$ into a complex symbol.

Furthermore, in said step (c1), an $N_{cpc} \times L$ row-column interleaver is utilized, and for quadrature phase shift keying, 8 phase shift keying, 16 quadrature amplitude modulation and 64 quadrature amplitude modulation, $N_{cpc}$ is respectively 2, 6, 4 and 6; $L = 2N_{cbps}/N_{cpc}$, wherein an interleaving length $N_{cbps}$ is equal to a length $L_k$ of a $k^{th}$ hybrid automatic repeat request packet, and the interleaving is represented by the following arrangement formula:
codeword bits before arrangement are $C_0, C_1, \ldots, C_{N_{cbps}-1}$,
codeword bits after arrangement are $D_0, D_1, \ldots, D_{N_{cbps}-1}$,
the formula is defined as:

$$D_k = C_{(N_{cpc}/2) \cdot k \bmod L + \lfloor k/L \rfloor} \quad L = 2N_{cbps}/N_{cpc}, k=0,1,\ldots,N_{cbps}-1$$

in said step (c2), each m=log 2(M) bits of said codeword bits $D_0, D_1, \ldots, D_{N_{cbps}-1}$ starting from zero form a group and are mapped to a modulation symbol, and M represents a modulation order.

In order to solve the above technical problem, the present invention also provides a method for modulation mapping in hybrid automatic repeat request of a low density parity check code, comprising:

letting a bit sequence encoded through structured low density parity check encoding before modulation be $D_0, D_1, \ldots, D_{N_{cbps}-1}$, and a complex symbol sequence after modulation be $S_0, S_1, \ldots, S_{N_{sym}-1}$, a $k^{th}$ symbol $S_k$ corresponding to a binary sequence $(b_{m-1,k}, \ldots, b_{0,k})$, and $S_k$ comprising a real part $S_k^I$ and an imaginary part $S_k^Q$, modulation orders for quadrature phase shift keying, 8 phase shift keying, 16 quadrature amplitude modulation and 64 quadrature amplitude modulation being respectively 2, 3, 4 and 6, then the input binary data $D_0, D_1, \ldots, D_{N_{cbps}-1}$ for modulation being mapped to a constellation according to the following formulas:

if the modulation is quadrature phase shift keying:

$$(b_{1,k}, b_{0,k}) = (D_{2k}, D_{2k+1}) \ k=0,1,\ldots,N_{cbps}/2-1$$

if the modulation is 8 phase shift keying:

$$(b_{2,k}, b_{1,k}, b_{0,k}) = (D_k, D_{k+N_{cbps}/3}, D_{k+2 \cdot N_{cbps}/3}) \ k=0,1,\ldots N_{cbps}/3-1$$

if the modulation is 16 quadrature amplitude modulation:

$$(b_{3,k}, b_{2,k}, b_{1,k}, b_{0,k}) = (D_k, D_{k+N_{cbps}/4}, D_{k+N_{cbps}/2}, D_{k+3 \cdot N_{cbps}/4}) \ k=0,1,\ldots N_{cbps}/4-1$$

if the modulation is 64 quadrature amplitude modulation:

$$(b_{5,k}, b_{4,k}, b_{3,k}, b_{2,k}, b_{1,k}, b_{0,k}) = (D_k, D_{k+N_{cbps}/6}, D_{k+N_{cbps}/3}, D_{k+N_{cbps}/2}, D_{k+2 \cdot N_{cbps}/3}, D_{k+5 \cdot N_{cbps}/6}). \ k=0,1,\ldots, N_{cbps}/6-1$$

It can be seen that, the processing chain of the method for channel encoding and modulation mapping in the HARQ of the LDPC code proposed by the present invention comprises LDCP coding, codeword arrangement, bits selection, channel interleaving, and modulation mapping. According to the code structure of the LDPC code, the present invention also provides a new channel interleaver which makes the high-order bits of the encoding blocks of HARQ sub-packets be mapped to the high-order bits of a constellation, thus the high-order bit mapping of the encoding blocks of the HARQ sub-packets gets a more reliable protection, while the low-order bits of the encoding blocks get a protection of low reliability. Ultimately, the channel interleaver provides the LDPC codeword with the maximal constellation gain and guarantees that the LDPC HARQ channel encoding chain has the optimal performance.

PREFERRED EMBODIMENTS OF THE PRESENT INVENTION

The basic idea of the present invention is to support HARQ based the LDPC code supporting any code length and any code rate, and the codeword arrangement guarantees that the codeword generated by the bits selection has the optimal puncturing distribution, and the codeword selection can be implemented with a very simple cyclic buffer, and the channel interleaving and modulation mapping can incorporate the characteristics of the LDPC codeword to provide the codeword with maximal constellation gain.

The present invention will be described in further detail in conjunction with figures and particular embodiments.

Figure 1:
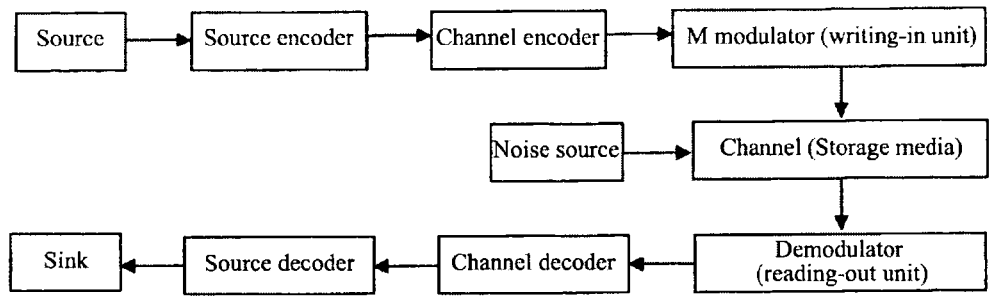
FIG. 1 is a schematic diagram of the system where the apparatus of the present invention resides.
Figure 2:
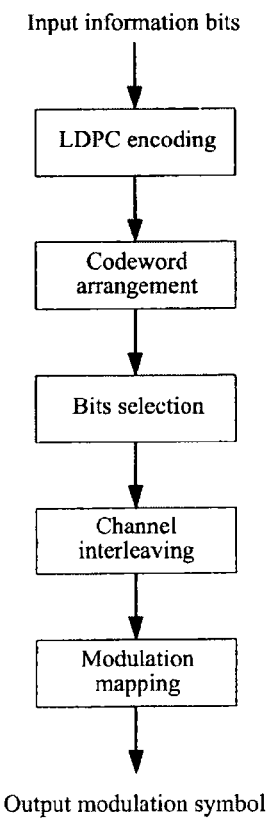
FIG. 2 is a schematic diagram of the channel encoding processing chain of the HARQ based on the LDPC code in accordance with an embodiment of the present invention.

The processing chain of the method for channel encoding and modulation mapping in the HARQ of the structured LDPC code supporting any code rate/code length in this embodiment comprises LDPC encoding, codeword arrangement, bits selection, channel interleaving, and modulation mapping. As shown in FIG. 2, said method specifically comprises the following steps:

1) LDPC encoding, which encodes an information bit sequence with an arbitrary length of K input by a channel encoder, then outputs a codeword bit sequence with an arbitrary length of $N_{FIR}$, and sends the generated codeword to an HARQ buffer, wherein the length of check bits is $M=N_{FIR}-K$, and the code rate is $r=K/N_{FIR}$;

2) Codeword arrangement, which rearranges codeword bits of the LDPC HARQ mother code in the HARQ buffer, maintains the sequences of information bits and extended check bits unchanged, and changes the sequence of punctured check bits;

3) Bits selection, which sequentially selects codeword bits from the rearranged codeword of the HARQ mother code, that is, the first transmission starts from the first system bit, and the starting position of each transmission afterwards follows the ending position of the previous transmission, so that a binary sequence of an HARQ packet is generated;

4) Channel interleaving, in which a $N_{cpc} \times L$ row-column interleaver interleaves the codeword bits of the HARQ packet, reading in by rows and reading out by columns. This arrangement guarantees that the high-order bits of the encoding blocks of the HARQ packet are mapped to high reliability bits in a constellation;

5) Modulation mapping, which sequentially maps the above codeword bits to a constellation, and for BPSK, QPSK, 8PSK, 16QAM or 64QAM, a group of input bits $b_{b-1}, \ldots, b_0$ are modulated into a complex symbol.

In the above channel encoding chain of the LDPC code, the step 1), i.e. the LDPC encoding step, can further divide into the following three sub-steps:

(11) Determine a mother code set of structured LDPC codes, said mother code set consists of a finite number of LDPC codes with different code lengths and the same code rate $R_0$, and said mother code set has a uniform base matrix $H_b^{uniform}$;

Said LDPC mother code set defines P ($N=z \times n_b$, $K=z \times k_b$) LDPC codes with different code lengths and the same code rate $R_0$ (Herein, N represents the LDPC codeword length and K represents the length of the information group, and for a LDPC code, the number of its check bits is M, and the size of its parity check matrix H is M*N). Wherein, Zset is a set of expand factors, and the expand factor z can be any element in Zset which is a set consisting of P positive integers $z_1 < z_2 < \ldots < z_{k-1} < z_k < \ldots < z_P$ larger than zero, and P is an integer larger than 1, and the code rate $R_0$ of the base matrix $H_b^{uniform}$ satisfies:

$$R_0 = \frac{(n_b - m_b)}{n_b}$$

Wherein, $n_b$ is the total number of columns in the base matrix and it is a certain integer larger than 2; $m_b$ is the number of rows in the base matrix and also the number of columns in the check bits part of the base matrix, and it is a certain integer larger than 1; $k_b$ is the number of columns in the information bits (also referred to as system bits) part of the base matrix, and $k_b = n_b - m_b$.

Figure 3:
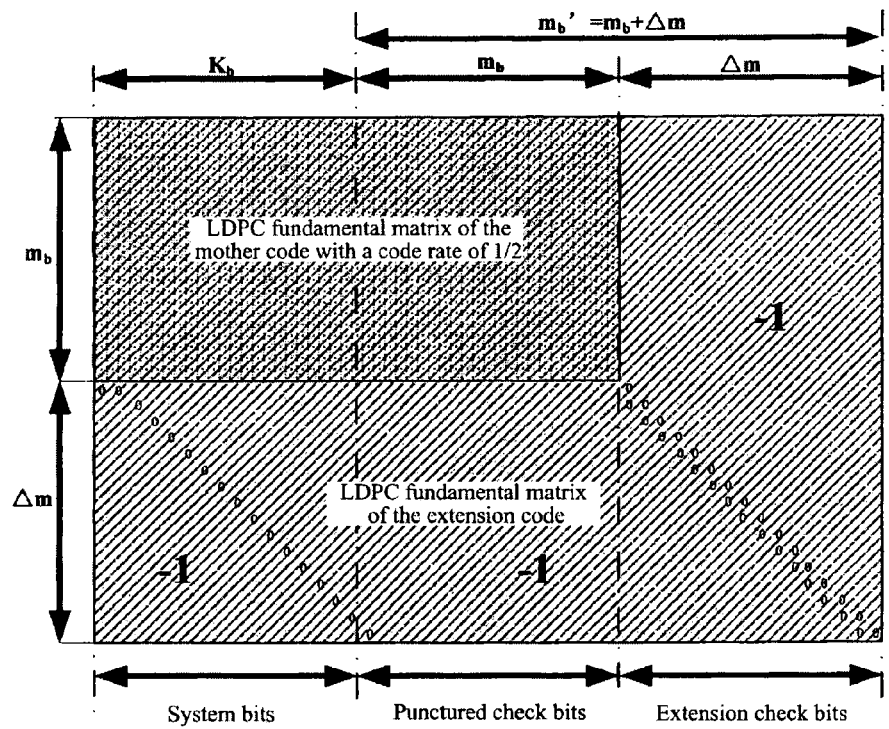
FIG. 3 is a schematic diagram of the extension base matrix proposed by the present invention.

(12) Determine an expand factor according to a matching information group length, and determine the parameters and matrix required by the encoder according to the expand factor and the base matrix $H_b^{uniform}$;

This step further divides into the following two cases:

A, if determining by comparison that the code rate r to be utilized in later encoding is less than $R_0$, the following sub-steps are performed in calculating the parameters and matrix required for the encoding:

12A1) Utilize $$\Delta m = \left\lceil \frac{k_b}{r} - n_b \right\rceil$$

to determine $\Delta m$, and add $\Delta m$ rows and $\Delta m$ columns respectively after the last row and the last column of the base matrix $H_b^{uniform}$ to extend it into a $(m_b+\Delta m) \times (n_b+\Delta m)$ extension base matrix $H_b^{uniform\_extension}$; here $\lceil \; \rceil$ represents ceiling;

The detailed extension method is as follows:

For a row index $i=m_b+1$ in the newly-added matrix part in $H_b^{uniform\_extension}$, there are always:

$H_b^{uniform\_extension}(i,i-m_b)=0$ $H_b^{uniform\_extension}(i,i-m_b+1)=0$ $H_b^{uniform\_extension}(i,i-m_b+n_b)=0$ As shown in FIG. 3, three zero elements in the first row of the extension part in the extension base matrix are defined here, and the other elements are −1.

For any row index i satisfying $m_b+2 \le i \le m_b+\Delta m$, there are:

$H_b^{uniform\_extension}(i,i-m_b+1)=0$ $H_b^{uniform\_extension}(i,i-m_b+n_b-1)=0$ $H_b^{uniform\_extension}(i,i-m_b+n_b)=0$ As shown in FIG. 3, three zero elements in the second, third, fourth, . . . rows of the extension part in the extension base matrix are defined here, and the other elements are −1.

Herein, both the row index and the column index start from 1, and by columns, the extension base matrix can be divided into a system bits part, i.e. information bits part (the number of columns is $k_b$), a punctured check bits part (the number of columns is $m_b$), and an extended check bits part (the number of columns is $\Delta m$).

12A2) Utilize the expand factor formula $$z_t = \frac{K}{k_b}$$

to determine the expand factor $z_t$, supposing $z_t$ has a relationship of $z_{k-1} < z_t \le z_k$ with elements in Zset, wherein $z_{k-1}, z_k$ are adjacent elements in values in Zset, then the expand factor required by the encoder is $z_k$;

12A3) Based on the extended uniform base matrix $H_b^{uniform\_extension}$ and the expand factor $z=z_k$, modify the $H_b^{uniform\_extension}$ according to a preset modification algorithm, a modified extension base matrix $H_b^{modified\_extension}$ with a size of $(N=(n_b+\Delta m) \times z_k, K=k_b \times z_k)$ required for the LDPC encoding can be calculated. Here, the modified extension base matrix is the matrix required for the encoding, and the expand factor and the matrix size are the parameters required for the encoding.

Said modification of the base matrix can utilize the Scale+floor modification formula, and the object of the modification is the element $(h_{ij}^b)_{uniform\_extension}$ representing the non-zero square in the $H_b^{uniform\_extension}$:

$$(h_{ij}^b)_{modified\_extension} = \left\lfloor (h_{ij}^b)_{uniform\_extension} \times \frac{z}{z_{max}} \right\rfloor$$

Wherein: $z_{max}$ is the maximum expand factor in Zset, e.g., it can be 640, and $\lfloor \; \rfloor$ represents flooring.

B, if determining by comparison that the code rate r to be utilized in later encoding is no less than $R_0$, the following sub-steps are performed in calculating the parameters and matrix required for the encoding:

12B1) Utilize the expand factor formula $$z_t = \frac{K}{k_b}$$

to determine the expand factor $z_t$, supposing $z_t$ has a relationship of $z_{k-1} < z_t \le z_k$ with elements in Zset, wherein $z_{k-1}, z_k$ are adjacent elements in values in Zset, then the expand factor required by the encoder is $z_k$;

12B2) Based on the uniform base matrix $H_b^{uniform}$ and the expand factor $z_k$, calculate a modified base matrix with a size of $(m_b \times z_k, n_b \times z_k)$ required for the encoding according to a preset modification algorithm and the expand factor. The modified base matrix is the matrix required for the encoding, and the expand factor and the matrix size are the parameters required for the encoding.

Similarly, said modification of the base matrix can utilize the Scale+floor modification formula, and the object of the modification is the element $(h_{ij}^b)_{uniform}$ representing the non-zero square in the $H_b^{uniform}$, that is:

$$(h_{ij}^b)_{modified} = \left\lfloor (h_{ij}^b)_{uniform} \times \frac{z}{z_{max}} \right\rfloor$$

Wherein: $z_{max}$ is the maximum expand factor in Zset.

(13) According to the parameters and matrix required for the encoding, the encoder encodes the input K bit information group and generates and outputs a $N_{FIR}$ bit codeword.

This step can be implemented by the following sub-steps:

131) Add $x=k_b \cdot z_k-K$ zero bits before the K information bits to form a $k_b \cdot z_k$ information group required for the encoding; and then perform $(N=(n_b+\Delta m) \times z_k, K=k_b \times z_k)$ LDPC encoding to form $(n_b+\Delta m) \times z_k$ encoding codeword bits;

132) In the above encoding codeword, delete the x zero bits added in step 131), and if the number of codeword bits after the deletion does not match the group size $N_{FIR}$ required, then continue to delete $y=(m_b+\Delta m) \times z_k - N_{FIR}+K$ bits in the codeword after deleting the zero bits to form a encoding codeword with a length of $N_{FIR}$.

In this embodiment, said $N_{FIR}$ has the following definition:

$$N_{FIR} = \begin{cases} N_{BUF} & N_{max} \ge N_{BUF} \\ N_{max} & N_{max} < N_{BUF} \end{cases}$$

Here, $N_{max}=K+n_b \cdot \lceil K/k_b \rceil$; $N_{BUF}$ is the maximum value of received soft bit information that can be stored in a virtual buffer, and the value is determined by an upper-level signaling in each HARQ transmission. Therefore, $N_{BUF}$ represents the maximum number of encoding bits into which the K bits can be encoded in the case of full incremental redundancy.

In deleting the above y bits, this embodiment deletes y bits at the end of the codeword, but bits at the other positions may also be deleted, as long as the system performance is not affected.

Content of the above steps can also be acquired with reference to the Chinese patent application of which the application number is 200710072808.0 and the patent name is "an apparatus and method for encoding the LDPC code supporting incremental redundancy HARQ".

In the above channel encoding chain of the LDPC code, in step (2), i.e., in the codeword arrangement step, it is required to rearrange codeword bits of the LDPC HARQ mother code in the HARQ buffer, maintain the sequences of information bits and extended check bits unchanged, and change the sequence of punctured check bits.

Let the codeword bits before the arrangement be $A_0, A_1, \ldots, A_{N_{FIR}-1}$, and the codeword bits after the arrangement be $B_0, B_1, \ldots, B_{N_{FIR}-1}$, then the arrangement formula is defined as follows:

$$B_k = \begin{cases} A_k & k < K \text{ and } k \geq n_b \cdot z_k - x \\ A_{(k+x) \bmod z_k + PV(\lfloor (k+x)/z_k \rfloor - k_b) \times z_k} & k \text{ is any other value} \end{cases}$$

Wherein, $\lfloor \rfloor$ represents flooring, $k=0,1,\ldots,N_{FIR}-1$, and PV is a punctured pattern vector comprising $m_b$ elements and consisting of integers from $k_b$ to $n_b-1$, and PV(l) is the index of the punctured vector PV and has l elements.

In the above channel encoding chain of the LDPC code, in the step 3), i.e., in the bits selection step, codeword bits are sequentially selected from the rearranged codeword of the HARQ mother code, that is, the first transmission starts from the first system bit, and the starting position of each transmission afterwards follows the ending position of the previous transmission, so that a binary sequence of an HARQ packet is generated;

The codeword bits selection rule can be a selection based on the following formula:

$$C_{k,i} = B_{(L_{total}(k-1)+i) \bmod (N_{FIR})}$$

Wherein, k represents the index of HARQ sub-packets, and when HARQ is applied, k=0 represents the first transmission, and the index of the sub-packet transmitted subsequently is incremented by one, and so forth. When HARQ is not applied, k=0. $L_k$ represents the length of the $k^{th}$ sub-packet, $$L_{total}(k) = \sum_{j=0}^{k-1} L_j$$

and $L_{total}(-1)$ is supposed to be zero. $C_{k,0}, C_{k,1}, \ldots, C_{k,L_k-1}$ are the codeword bits of the $k^{th}$ sub-packet, and $B_0, B_1, \ldots, B_{N_{FIR}-1}$ is the codeword of the HARQ mother code.

In the above channel encoding chain of the LDPC code, in the step 4), i.e., in the channel interleaving step, an $N_{cpc} \times L$ interleaver is utilized to interleave the codeword bits of the HARQ packet, reading in by rows and reading out by columns.

Figure 5:
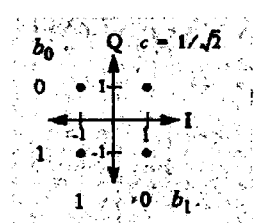
FIGS. 5(a), 5(b), 5(c) and 5(d) are respectively constellations of QPSK, 8PSK, 16QAM and 64QAM in accordance with an embodiment of the present invention.
Figure 5:
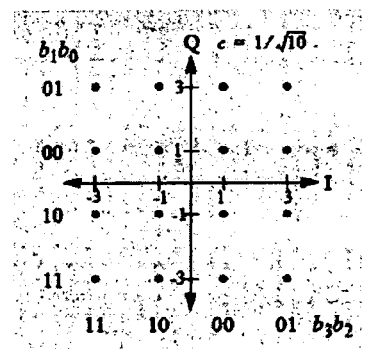
Figure 5:
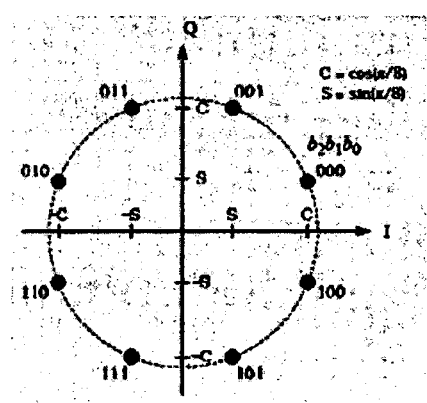
Figure 5:
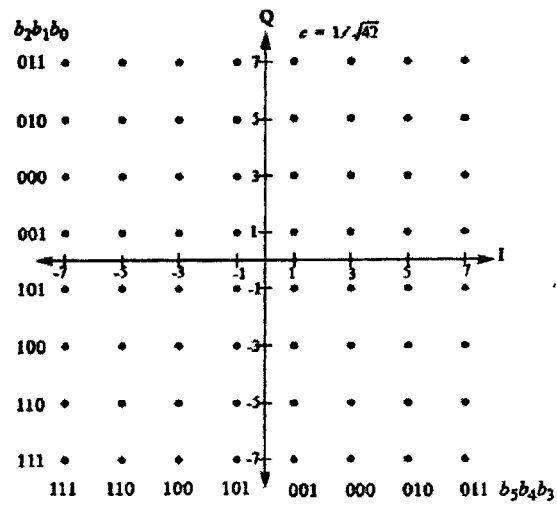

Here, for modulation modes of QPSK, 8PSK, 16QAM and 64QAM, $N_{cpc}$ is respectively 2, 6, 4 and 6, and $L=2N_{cbps}/N_{cpc}$, wherein the interleaving length $N_{cbps}$ is equal to the length of the $k^{th}$ HARQ packet $L_k$ (i.e. the number of codeword bits). Here, for I or Q mapping codeword bits, high-order bits have higher reliability. For 8PSK as shown in FIG. 5, b2b1 has comparatively high reliability, while b0 has comparatively low reliability, and for 16QAM and 64QAM, b3b1, b5b3b1 have comparatively high reliability, whereas b2b0 and b4b2b0 have comparatively low reliability. This interleaving can be defined with the following one step arrangement formula, Define $N_{cpc}$ for QPSK, 8PSK, 16QAM and 64QAM is respectively 2, 6, 4 and 6. An HARQ sub-packet comprises $N_{cbps}$ codeword bits, and let:

The codeword bits before the arrangement be $C_0, C_1, \ldots, C_{N_{cbps}-1}$, and the codeword bits after the arrangement be $D_0, D_1, \ldots, D_{N_{cbps}-1}$, then the formula is defined as follows:

$$D_k = C_{(N_{cpc}/2) \cdot k \bmod L + \lfloor k/L \rfloor} \quad L=2N_{cbps}/N_{cpc}, k=0,1,\ldots,N_{cbps}-1$$

The interleaving here is combined with the previously described structured LDPC encoding and has special functions and implements a technology of bits priority selection, thereby it is guaranteed that the high-order bits of the encoding blocks of the HARQ packet (for a code block, the left is high order and the right is low order) are mapped to high reliability bits in a constellation.

In the above channel encoding chain of the LDPC code, in the step 5), i.e., in the modulation mapping step, the above interleaved and arranged codeword bits are sequentially mapped to a constellation, and for BPSK, QPSK, 8PSK, 16QAM or 64QAM, a group of input bits $b_{m-b}, \ldots, b_0$ are modulated into a complex symbol. That is, each m=log 2(M) bits of the above codeword bits $D_0, D_1, \ldots, D_{N_{cbps}-1}$ starting from zero form a group and are mapped to a modulation symbol. Herein, M represents a modulation order.

In another embodiment, the above step 4) and 5) can be replaced by the following step (which are not steps specially for interleaving)

4') Let the encoded bit sequence before modulation (which is the binary sequence of the generated HARQ packet after the bits selection) be $D_0, D_1, \ldots, D_{N_{cbps}-1}$, and the complex symbol sequence after modulation be $S_0, S_1, \ldots, S_{N_{sym}-1}$, wherein the $k^{th}$ symbol $S_k$ corresponds to a binary sequence $(b_{m-1,k}, \ldots, b_{0,k})$, and $S_k$ comprises a real part $S_k^I$ and an imaginary part $S_k^Q$.

The modulation orders for QPSK, 8PSK, 16QAM and 64QAM are respectively 2, 3, 4 and 6. Then the input binary data $D_0, D_1, \ldots, D_{N_{cbps}-1}$ for modulation is mapped to the constellation according to the following formulas:

If the modulation mode is QPSK:

$$(b_{1,k}, b_{0,k}) = (D_{2k}, D_{2k+1}) \quad k=0,1,\ldots,N_{cbps}/2-1$$

If the modulation mode is 8PSK:

$$(b_{2,k}, b_{1,k}, b_{0,k}) = (D_k, D_{k+N_{cbps}/3}, D_{k+2 \cdot N_{cbps}/3}) \quad k=0,1,\ldots N_{cbps}/3-1$$

If the modulation mode is 16QAM:

$$(b_{3,k}, b_{2,k}, b_{1,k}, b_{0,k}) = (D_k, D_{k+N_{cbps}/4}, D_{k+N_{cbps}/2}, D_{k+3 \cdot N_{cbps}/4}) \quad k=0,1,\ldots N_{cbps}/4-1$$

If the modulation mode is 64QAM:

$$(b_{5,k}, b_{4,k}, b_{3,k}, b_{2,k}, b_{1,k}, b_{0,k}) = (D_k, D_{k+N_{cbps}/6}, D_{k+N_{cbps}/3}, D_{k+N_{cbps}/2}, D_{k+2 \cdot N_{cbps}/3}, D_{k+5 \cdot N_{cbps}/6}) \quad k=0,1,\ldots,N_{cbps}/6-1$$

This can achieve the same effect as that of the above steps 4) and 5), that is, it guarantees that the high-order bits of the encoding blocks of the HARQ packet are mapped to high reliability bits of the constellation.

A practical example is used below to further illustrate the technology of the present invention, but the present invention is not limited to this example.

Step 1: firstly, modify a mother code set of LDPC codes and acquire a modified base matrix.

For a mother code set of structured LDPC codes with a specific code rate $R_0=\frac{1}{2}$ and multiple code lengths, the size of the uniform base matrix of the mother code set is $m_b \times n_b = 16 \times 32$, and the expand factor of the code set increases from $z_{min}=18$ to $z_{max}=640$ with a step of 1, denoted by $z \in Zset=\{z_{min}1:z_{max}\}$. Since a specific code length $N_{FIR}$ corresponds to a specific expand factor z, the length of the information group increases from $z_{min} \times k_b$ to $z_{max} \times n_b$ with a step of $k_b$, denoted by $K \in \{z_{min} \times k_b : k_b : z_{max} \times k_b\} = \{288:16:10240\}$.

An illustration of the uniform base matrix $H_b^{uniform}$ of the mother code set with the code rate $R_0=\frac{1}{2}$ is as follows:

$$H_b^{uniform} = \begin{pmatrix}
605 & 173 & 110 & -1 & 274 & -1 & -1 & -1 & 8 & -1 & 242 & -1 & -1 & -1 & -1 & 108 & -1 & -1 & -1 & -1 & -1 & -1 & -1 & -1 \\
194 & 77 & 265 & 571 & -1 & -1 & -1 & -1 & -1 & -1 & -1 & -1 & 246 & -1 & -1 & -1 & 0 & -1 & -1 & -1 & -1 & -1 & -1 & -1 \\
63 & 0 & 538 & -1 & -1 & -194 & -1 & -1 & 411 & -1 & -1 & -1 & -1 & -1 & 0 & -1 & -1 & 0 & -1 & -1 & -1 & -1 & -1 & -1 \\
23 & 271 & 260 & 166 & -1 & -1 & 348 & -1 & -1 & 111 & -1 & 566 & -1 & -1 & -1 & -1 & -1 & -1 & 0 & -1 & -1 & -1 & -1 & -1 \\
238 & 241 & 574 & 466 & -1 & -1 & -1 & 321 & -1 & -1 & -1 & -1 & 446 & -1 & -1 & -1 & -1 & -1 & -1 & 0 & -1 & -1 & -1 & -1 \\
601 & 442 & 474 & 218 & -1 & -1 & -1 & -1 & -1 & -1 & -1 & -1 & -1 & 454 & -1 & -1 & -1 & -1 & -1 & -1 & 0 & -1 & -1 & -1 \\
56 & 148 & 618 & -1 & -1 & 363 & 485 & -1 & -1 & -1 & 112 & -1 & -1 & -1 & -1 & -1 & -1 & -1 & -1 & -1 & -1 & 0 & -1 & -1 \\
495 & 178 & 459 & 270 & -1 & -1 & -1 & -1 & 241 & 346 & -1 & -1 & -1 & -1 & 193 & -1 & -1 & -1 & -1 & -1 & -1 & -1 & 0 & -1 \\
611 & 380 & 170 & -1 & -1 & -1 & -1 & -1 & -1 & 436 & -1 & -1 & -1 & -1 & -1 & -1 & -1 & -1 & -1 & -1 & -1 & -1 & -1 & 0 \\
343 & 255 & 353 & 405 & 317 & -1 & -1 & 436 & -1 & -1 & 552 & -1 & -1 & -1 & -1 & -1 & -1 & -1 & -1 & -1 & -1 & -1 & -1 & -1 \\
630 & 42 & 282 & -1 & -1 & -1 & -1 & -1 & -1 & -1 & -1 & -1 & 96 & -1 & -1 & -1 & 12 & -1 & -1 & -1 & -1 & -1 & -1 & -1 \\
194 & 479 & 621 & 170 & -1 & 567 & -1 & -1 & -1 & -1 & -1 & -1 & -1 & -1 & -1 & -1 & -1 & -1 & -1 & -1 & -1 & -1 & -1 & -1 \\
352 & 158 & 73 & -1 & -1 & -1 & 471 & 187 & -1 & -1 & -1 & -1 & -1 & -1 & -1 & -1 & -1 & 218 & -1 & -1 & -1 & -1 & -1 & -1 \\
524 & 595 & 329 & 185 & -1 & 532 & -1 & -1 & -1 & -1 & -1 & -1 & -1 & -1 & -1 & -1 & -1 & -1 & 501 & -1 & -1 & -1 & -1 & -1 \\
573 & 48 & 108 & -1 & 452 & -1 & -1 & -1 & -1 & -1 & -1 & -1 & 195 & -1 & -1 & -1 & -1 & -1 & -1 & 536 & -1 & -1 & -1 & -1 \\
293 & 5 & 409 & 9 & -1 & -1 & -1 & -1 & -1 & -1 & -1 & -1 & -1 & 285 & -1 & 552 & -1 & -1 & -1 & -1 & 0 & -1 & -1 & 0
\end{pmatrix}$$

However, the definition of $H_b^{uniform}$ is not limited to this matrix, and can be another matrix.

In order to implement the encoding and decoding of the $(z \times n_b, z \times k_b)$ LDPC code, it is required to modify the uniform base matrix $H_b^{uniform}$ with some modification operation as described previously and the expand factor z, to acquire the modified base matrix $H_b^{modified}$, and based on the $H_b^{modified}$ and z, the parity check matrix can be acquired. This example utilizes the Scale+floor modification formula to modify the uniform base matrix, and the object of the modification is the element $(h_{ij}^b)_{uniform}$ representing the non-zero square of the $H_b^{uniform}$, herein $z_{max}$=640:

$$(h_{ij}^b)_{modified} = \left\lfloor (h_{ij}^b)_{uniform} \times \frac{z}{z_{max}} \right\rfloor = \left\lfloor (h_{ij}^b)_{uniform} \times \frac{z}{640} \right\rfloor$$

In a case in which the code rate r<$R_0$, based on the mother code set provided in the embodiment, that is, $$R_0 = \frac{K}{N_{FIR}} = 1/2,$$

the encoding method with the LDPC code supporting any length/code rate provided in the present invention is described in detail as follows:

The code rate $$r = \frac{K}{N_{FIR}} < R_0 = \frac{1}{2},$$

the length of the information group before encoding is K, the codeword length after encoding is $N_{FIR}$, z is the expand factor of the structured LDPC code, and the number of check bits required is M=$N_{FIR}$−K.

According to the above encoding method with the LDPC code supporting any code rate/code length, the encoding of the ($N_{FIR}$,K) LDPC code is implemented, and it comprises the following steps:

Step A1, code rate matching: calculate $$\Delta m = \left\lceil \frac{k_b}{r} - n_b \right\rceil = \left\lceil \frac{16}{r} - 32 \right\rceil,$$

and add $\Delta m$ rows and $\Delta m$ columns respectively after the last row and the last column of $H_b^{uniform}$ to extend it into a base matrix $H_b^{uniform\_extension}$ with a size of $(m_b+\Delta m) \times (n_b+\Delta m)$ = $(16+\Delta m) \times (32+\Delta m)$; herein $\lceil\ \rceil$ represents ceiling.

Step A2, code length matching: calculate the expand factor $$z_t = \frac{K}{k_b} = \frac{K}{16},$$

supposing $z_t$ has a relationship of $z_{k-1} < z_t \leq z_k$ with elements in Zset, wherein $z_{k-1}, z_k$ are the two adjacent elements in values in Zset; $z_k$ is the expand factor that we ultimately require; based on the extended uniform base matrix $H_b^{uniform\_extension}$ and the calculated expand factor $z_k$, the LDPC mother code of (N=$(n_b+\Delta m) \times z_k$, K=$k_b \times z_k$)=$((32+\Delta m) \times z_k, 16 \times z_k)$ can be acquired.

Step A3, curtailing the encoding: add x=$(k_b \cdot z_k - K)$=$(16 \cdot z_k - K)$ zero bits before the K information bits to construct a $16 \times z_k$ information group required for encoding; and then perform (N=$(n_b+\Delta m) \times z_k$, K=$k_b \times z_k$)=$((32+\Delta m) \times z_k, 16 \times z_k)$ LDPC encoding to acquire a $(n_b+\Delta m) \times z_k$=$(32+\Delta m) \times z_k$ bit codeword;

Step A4, symbol deletion: delete the x zero bits added in step B3 from the encoded codeword of the mother code, and if the number of codeword bits after the deletion does not match the group size $N_{FIR}$ required, then delete the last (or other positions) y bits of the codeword after deleting the zero bits, i.e., the y=$(m_b+\Delta m) \times z_k - N_{FIR} + K$=$(16+\Delta m) \times z_k - N_{FIR} + K$ bits, to finally acquire a codeword with a length of $N_{FIR}$, wherein the determination of $N_{FIR}$ is as described previously and will not be repeated here.

In another case in which the code rate r≧$R_0$, based on the mother code set provided in the embodiment, that is, $$\left(r = \frac{K}{N_{FIR}}\right) \geq \left(R_0 = \frac{1}{2}\right),$$

the encoding method with the LDPC code supporting any length/code rate provided in the present invention is described in detail as follows:

The code rate $$\left(r = \frac{K}{N_{FIR}}\right) \geq \left(R_0 = \frac{1}{2}\right),$$

the length of the information group before encoding is K, the codeword length after encoding is $N_{FIR}$, $z_k$ is the expand factor of the structured LDPC code, and the number of check bits required is M=$N_{FIR}$−K.

According to the above encoding method with the LDPC code supporting any code rate/code length, the encoding of the ($N_{FIR}$,K) LDPC code is implemented, and it comprises the following steps:

Step C1, code rate matching: calculate the expand factor $$z = \left\lceil \frac{K}{k_b} \right\rceil = \left\lceil \frac{K}{16} \right\rceil,$$

and based on the uniform base matrix $H_b^{uniform}$ and the calculated expand factor z, acquire the LDPC mother code with a size of $(n_b \times z, m_b \times z)$=$(32 \times z, 16 \times z)$.

Step C2, curtailing the encoding: add x=$(k_b \times z - K)$=$(16 \times z - K)$ zero bits before the K information bits to construct a $k_b \times z$=$16 \times z$ bit information group required for encoding; and then perform the (N=$n_b \times z$=$32 \times z$, K=$k_b \times z$=$16 \times z$) LDPC encoding to acquire a $n_b \times z$=$32 \times z$ bit codeword;

Step C3, symbol deletion: delete the x zero bits added in step C2 from the codeword of the mother code, and if the number of the codeword bits after the deletion is not equal to N, continue to delete the last (or other positions) y=$m_b \times z - N_{FIR} + K$=$16 \times z - N_{FIR} + K$ bits of the codeword after deleting the zero bits, to acquire a codeword with a length of $N_{FIR}$, wherein the determination of $N_{FIR}$ is as described previously and will not be repeated here.

Step 2, rearrange the codeword bits of the LDPC HARQ mother code in the HARQ buffer, maintain the sequences of the information bits and extended check bits unchanged, and change the sequence of the punctured check bits;

The arrangement of the LDPC HARQ codeword bits is: let the codeword bits before the arrangement be $A_0, A_1, \ldots, A_{N_{FIR}-1}$, and the codeword bits after the arrangement be $B_0, B_1, \ldots, B_{N_{FIR}-1}$, then the arrangement formula is defined as:

$$B_k = \begin{cases} A_k & k < K \text{ and } k \geq n_b \cdot z - x \\ A_{(k+x) \bmod z_k + PV(\lfloor (k+x)/z_k \rfloor - k_b) \times z_k} & k \text{ is any other value} \end{cases}$$

Wherein, $\lfloor \; \rfloor$ represents flooring, $k=0,1,\ldots,N_{FIR}-1$, PV is a punctured pattern vector comprising $m_b$ elements and consisting of integers from $k_b$ to $n_b-1$, supposing:

PV=[17, 19, 21, 23, 25, 27, 29, 31, 18, 24, 22, 28, 30, 20, 26, 16], and PV(l) represents the index of the punctured vector PV and comprises l elements.

Step 3, sequentially select codeword bits from the rearranged codeword of the HARQ mother code, that is, the first transmission starts from the first system bit, and the starting position of each transmission afterwards follows the ending position of the previous transmission, so that a binary sequence of an HARQ packet is generated;

The codeword bits selection rule is a selection based on the following formula:

$$C_{k,i} = B_{(L_{total}(k-1)+i) \bmod (N_{FIR})}$$

Wherein, k represents the index of HARQ sub-packets, and when HARQ is applied, k=0 represents the first transmission, and the index of the sub-packet transmitted subsequently is incremented by one, and so forth, when HARQ is not applied, k=0. $L_k$ represents the length of the $k^{th}$ sub-packet, $$L_{total}(k) = \sum_{j=0}^{k-1} L_j$$

and suppose $L_{total}(-1)$ is zero. Let $C_{k,0}, C_{k,1}, \ldots, C_{k,L_k-1}$ be the codeword bits of the $k^{th}$ sub-packet, and $B_0, B_1, \ldots, B_{N_{FIR}-1}$ be the codeword of the HARQ mother code.

Figure 4:
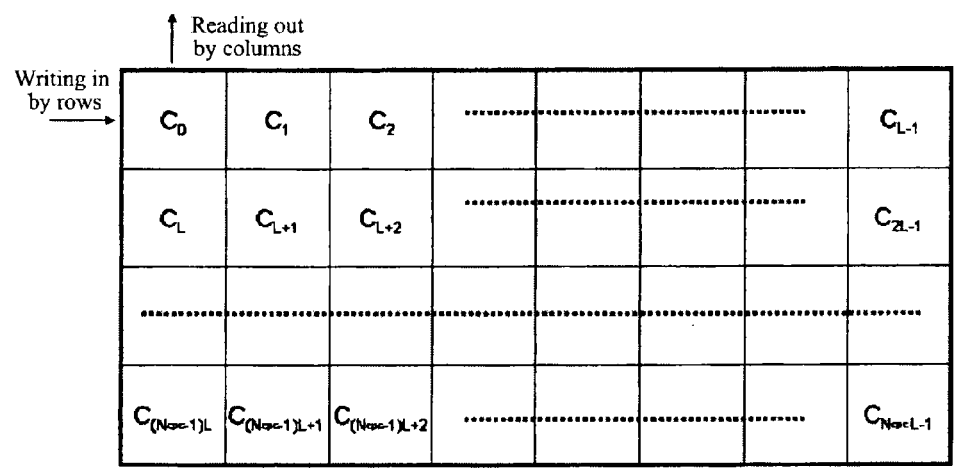
FIG. 4 is a schematic diagram of the interleaving by the channel interleaver proposed by the present invention.

Step 4, as shown in FIG. 4, a block interleaver is used to interleave the codeword bits of the HARQ packet, and the length of the interleaving $N_{cbps}$ is equal to the length of the $k^{th}$ HARQ packet $L_k$. This interleaving can be defined by an arrangement formula. This arrangement guarantees that the high-order bits of the codeword are mapped to high reliability bits in a constellation, which will improve the performance of the punctured code. Here, for I or Q mapping codeword bits, the high-order bits have higher reliability. For 8PSK shown in FIG. 5, b2b1 has comparatively high reliability, while b0 has comparatively low reliability, and for 16QAM and 64QAM, b3b1, b5b3b1 have comparatively high reliability, whereas b2b0 and b4b2b0 have comparatively low reliability.

It is defined that for QPSK, 8PSK, 16QAM and 64QAM, $N_{cpc}$ is respectively 2, 6, 4 and 6. An HARQ sub-packet comprises $N_{cbps}$ codeword bits, and let the codeword bits before the arrangement be $C_0, C_1, \ldots, C_{N_{cbps}-1}$ and the codeword bits after the arrangement be $D_0, D_1, \ldots, D_{N_{cbps}-1}$, then the arrangement formula is defined as:

$$D_k = C_{(N_{cpc}/2) \cdot k \bmod L + \lfloor k/L \rfloor}, \; L = 2N_{cbps}/N_{cpc}, \; k=0,1,\ldots,N_{cbps}-1$$

Step 5, sequentially map the above codeword bits to a constellation, and the constellations for QPSK, 8PSK, 16QAM and 64QAM are shown in FIG. 5.

For QPSK, m=log 2(4)=2, that is, each two bits of the codeword bits $D_0, D_1, \ldots, D_{N_{cbps}-1}$ starting from index 0 form a group, such as $[D_0,D_1], [D_2,D_3], \ldots, [D_{N_{cbps}-2} D_{N_{cbps}-1}]$, and are respectively mapped to the constellation points $b_1 b_0$.

For 8PSK, m=log 2(8)=3, that is, each three bits of the codeword bits $D_0, D_1, \ldots, D_{N_{cbps}-1}$ starting from index 0 form a group, such as $[D_0,D_1,D_2], [D_3,D_4,D_5], \ldots, [D_{N_{cbps}-3} D_{N_{cbps}-2} D_{N_{cbps}-1}]$, and are respectively mapped to the constellation points $b_2 b_1 b_0$.

For 16QAM, m=log 2(16)=4, that is, each four bits of the codeword bits $D_0, D_1, \ldots, D_{N_{cbps}-1}$ starting from index 0 form a group, such as $[D_0,D_1,D_2,D_3], [D_4,D_5,D_6,D_7], \ldots, [D_{N_{cbps}-4} D_{N_{cbps}-3} D_{N_{cbps}-2} D_{N_{cbps}-1}]$, and are respectively mapped to the constellation points $b_3 b_2 b_1 b_0$.

For 64QAM, m=log 2(64)=6, that is, each six bits of the codeword bits $D_0, D_1, \ldots, D_{N_{cbps}-1}$ starting from index 0 form a group, such as $[D_0,D_1,D_2,D_3,D_4,D_5], [D_6,D_7,D_8,D_9,D_{10},D_{11}], \ldots, [D_{N_{cbps}-6} D_{N_{cbps}-5} D_{N_{cbps}-4} D_{N_{cbps}-3} D_{N_{cbps}-2} D_{N_{cbps}-1}]$, and are respectively mapped to the constellation points $b_5 b_4 b_3 b_2 b_1 b_0$.

To sum up, the present invention proposes a channel encoding processing chain of the HARQ of the LDPC code, and the chain comprises LDCP coding, codeword arrangement, bits selection, channel interleaving, and modulation mapping, as shown in FIG. 2. According to the code structure of the LDPC code, the present invention also provides a new channel interleaver which makes the high-order bits of the encoding blocks of HARQ sub-packets be mapped to the high-order bits of a constellation, thus the high-order bit mapping of the encoding blocks of the HARQ sub-packets gets a more reliable protection, while the low-order bits of the encoding blocks get a protection of low reliability. Finally, the channel interleaver provides the LDPC codeword with the maximal constellation gain and guarantees that the LDPC HARQ channel encoding chain has the optimal performance.

Here, the present invention has been described in detail with particular embodiments, the description of the above embodiments is provided for those skilled in the art to manufacture or use the present invention, and various modifications of these embodiments are easy to understand for those skilled in the art. The present invention is not limited to these embodiments or some aspects therein. The scope of the present invention will be illustrated in detail by the appended claims.

INDUSTRIAL APPLICABILITY

The present invention proposes a method for channel encoding and modulation mapping in the HARQ of the LDPC code, and the processing chain comprises LDCP coding, codeword arrangement, bits selection, channel interleaving, and modulation mapping. According to the code structure of the LDPC code, the present invention also provides a new channel interleaver which makes the high-order bits of the encoding blocks of HARQ sub-packets be mapped to the high-order bits of a constellation, thus the high-order bit mapping of the encoding blocks of the HARQ sub-packets gets a more reliable protection, while the low-order bits of the encoding blocks get a protection of low reliability. The channel interleaver provides the LDPC codeword with the maximal constellation gain and guarantees that the LDPC HARQ channel encoding chain has the optimal performance.

What we claim is:

1. A method for channel coding and modulation mapping for hybrid automatic repeat request of a low density parity check code, comprising the following steps of:
  (a) performing structured low density parity check encoding of an information bit sequence of length K as the input of a channel encoder, and sending a generated codeword to a hybrid automatic repeat request buffer;

(b) rearranging the said codeword bits of a low density parity check hybrid automatic repeat request mother code in the hybrid automatic repeat request buffer, and sequentially selecting codeword bits to generate a binary sequence of a hybrid automatic repeat request packet;

(c) mapping the codeword bits of the hybrid automatic repeat request packet to a constellation, wherein the high significant bits in the encoding block of the hybrid automatic repeat request packet are mapped to high reliability bits in the constellation.

2. A method of claim 1, wherein said step (a) further divides into the following sub-steps of:

(a1) determining a mother code set of low density parity check codes, said mother code set consisting of a finite number of low density parity check codes with different code lengths and the same code rate, wherein the code rate is denoted as $R_0$, and said mother code set has a uniform base matrix $H_b^{uniform}$ with a size of $m_b \times n_b$, and the number of columns of an information bits part in the uniform base matrix is $k_b = n_b - m_b$;

(a2) determining an expand factor $z_k$ according to a matching information group length, and determining parameters and a matrix required by an encoder according to the expand factor and the uniform base matrix $H_b^{uniform}$;

(a3) according to the parameters and matrix required for encoding, the encoder encoding the input information block of K bits, and generating and outputting a codeword of $N_{FIR}$ bits.

3. A method of claim 2, wherein, if a code rate r to be used in the encoding is less than $R_0$, said step (a2) divides into the following sub-steps of:

a2A1) determining $\Delta m$ through a formula $$\Delta m = \left\lceil \frac{k_b}{r} - n_b \right\rceil$$

adding $\Delta m$ rows and $\Delta m$ columns respectively after the last row and last column of the uniform base matrix $H_b^{uniform}$ to extend the base matrix $H_b^{uniform}$ into a $(m_b+\Delta m) \times (n_b+\Delta m)$ extension base matrix $H_b^{uniform\_extension}$, the extension base matrix consisting of a system bits part, that is, an information bits part, a punctured check bits part and an extended check bits part, wherein $\lceil \ \rceil$ represents the ceiling operation;

a2A2) determining an expand factor $z_t$ through an expand factor formula $$z_t = \frac{K}{k_b}$$

if $z_t$ has a relationship of $z_{k-1} < z_t \leq z_k$ with elements in an Zset, wherein Zset is a set of expand factors which are positive integers, and $z_{k-1}, z_k$ are two adjacent elements in magnitude in the Zset, then the expand factor required by the encoder being $z_k$;

a2A3) based on the extended uniform base matrix $H_b^{uniform\_extension}$ and the expand factor $z_k$, modifying the $H_b^{uniform\_extension}$ according to a preset modification algorithm, thereby acquiring a modified extension base matrix $H_b^{modified\_extension}$ with a size of $(N=(n_b+\Delta m) \times z_k, K=k_b \times z_k)$ required for the low density parity check encoding, wherein N is the codeword length of the low density parity check encoding, and K is the length of the information group, the modified extension base matrix is the matrix required for the encoding, and the expand factor and the matrix size are the parameters required for the encoding;

if the code rate r to be used in the encoding is no less than $R_0$, the following sub-steps are performed in step (a2):

a2B1) determining an expand factor $z_t$ through a formula $$z_t = \frac{K}{k_b}$$

if $z_t$ has a relationship of $z_{k-1} < z_t \leq z_k$ with elements in an Zset, wherein Zset is a set of expand factors which are positive integers, and $z_{k-1}, z_k$ are two adjacent elements in magnitude in the Zset, then the expand factor required by the encoder being $z_k$;

a2B2) based on the uniform base matrix $H_b^{uniform}$ and the expand factor $z_k$, calculating a modified base matrix with a matrix size of $(m_b \times z_k, n_b \times z_k)$ required for the encoding according to a preset modification algorithm and the expand factor, the modified base matrix being the matrix required for the encoding, and the expand factor and the matrix size being the parameters required for the encoding;

step (a3) further divides into the following steps of:

a31) adding $x = k_b \cdot z_k - K$ zero bits before the K information bits to form an information group with the length of $k_b \cdot z_k$ required for the encoding; and then performing $(N=(n_b+\Delta m) \times z_k, K=k_b \times z_k)$ low density parity check encoding to form $(n_b+\Delta m) \times z_k$ encoding codeword bits;

a32) from said encoding codeword, deleting the x zero bits added, and if the number of codeword bits after the deletion does not match the group size $N_{FIR}$ required, then continuing to delete $y=(m_b+\Delta m) \times z_k - N_{FIR} + K$ bits from the codeword after deleting the zero bits, to form an encoding codeword with the length of $N_{FIR}$.

4. A method of claim 1, further comprising:

when the codeword bits of the low density parity check hybrid automatic repeat request mother code in the hybrid automatic repeat request buffer is rearranged in step (b), rearranging the codeword bits of the low density parity check hybrid automatic repeat request mother code in the hybrid automatic repeat request buffer, while maintaining the sequences of information bits and extended check bits unchanged, and changing the sequence of punctured check bits, that is, if codeword bits before the arrangement are $A_0, A_1, \ldots, A_{N_{FIR}-1}$ and codeword bits after the arrangement are $B_0, B_1, \ldots, B_{N_{FIR}-1}$, then a formula for the arrangement is:

$$B_k = \begin{cases} A_k & k < K \text{ and } k \geq n_b \cdot z_k - x \\ A_{(k+x) \bmod z_k + PV(\lfloor (k+x)/z_k \rfloor - k_b) \times z_k} & k \text{ is any other value} \end{cases}$$

wherein $\lfloor \ \rfloor$ represents the flooring operation, $k=0,1,\ldots,N_{FIR}-1$, $N_{FIR}$ is the number of the codeword bits of the low density parity check hybrid automatic repeat request mother code in the hybrid automatic repeat request buffer, PV is a punctured pattern vector comprising $m_b$ elements and consisting of integers from $k_b$ to $n_b-1$, $m_b$ is the number of rows of a uniform base matrix, $n_b$ is the number of columns of the uniform base matrix, $k_b$ is the number of columns of an information bits part in the uniform base matrix and $k_b=n_b-m_b$, PV(l) is an index of the punctured vector PV and has l elements, x is the number of zero bits added before the K information bits, and $z_k$ is the expand factor of the structured low density parity check encoding.

5. A method of claim 1, further comprising:
when codeword bits are sequentially selected from the codeword of the rearranged hybrid automatic repeat request mother code in step (b), starting from a first system bit in a first transmission, a starting position of each transmission afterwards following an ending position of a previous transmission, so that a binary sequence of a hybrid automatic repeat request packet is generated, and a formula being:

$$C_{k,i} = B_{(L_{total}(k-1)+i) mod(N_{FIR})}$$

wherein k represents an index of a hybrid automatic repeat request sub-packet, when hybrid automatic repeat request is applied, k=0 represents the first transmission, and the index of a sub-packet transmitted subsequently is incremented by one, and so forth, when hybrid automatic repeat request is not applied, k=0; $L_k$ represents a length of a $k^{th}$ sub-packet, $$L_{total}(k) = \sum_{j=0}^{k-1} L_j$$

and $L_{total}(-1)$ is set to zero, i=0,1, . . . , $L_k$−1, $C_{k,0}$, $C_{k,1}$, . . . , $C_{k,L_k-1}$ are codeword bits of the $k^{th}$ sub-packet, and $B_0$, $B_1$, . . . , $B_{N_{FIR}-1}$ is the codeword of the hybrid automatic repeat request mother code, $N_{FIR}$ is the number of codeword bits of the hybrid automatic repeat request mother code.

6. A method of claim 1, further comprising:
when the codeword bits of the hybrid automatic repeat request packet are mapped to the constellation in step (c), firstly performing interleaving, and then performing mapping, and step (c) comprising the following steps of:
(c1) utilizing an interleaver to interleave the codeword bits of the hybrid automatic repeat request packet, reading in by rows and reading out by columns, and guaranteeing that the high-order bits in the encoding blocks of the hybrid automatic repeat request packet are mapped to high reliability bits in the constellation;
(c2) sequentially mapping said codeword bits to the constellation, and for binary phase shift keying, quadrature phase shift keying, 8 phase shift keying, 16 quadrature amplitude modulation, or 64 quadrature amplitude modulation, modulating a group of input bits $b_{m-1}$, . . . , $b_0$ into a complex symbol, wherein m=log 2(M), and M is a modulation order.

7. A method of claim 6, wherein,
in said step (c1), an $N_{cpc} \times L$ row-column interleaver is utilized, and for quadrature phase shift keying, 8 phase shift keying, 16 quadrature amplitude modulation and 64 quadrature amplitude modulation, $N_{cpc}$ is respectively 2, 6, 4 and 6; $L=2N_{cbps}/N_{cpc}$, wherein an interleaving length $N_{cbps}$ is equal to a length $L_k$ of a $k^{th}$ hybrid automatic repeat request sub-packet, and the interleaving is represented by the following arrangement formula:
codeword bits before arrangement are $C_0, C_1, \ldots, C_{N_{cbps}-1}$, codeword bits after arrangement are $D_0, D_1, \ldots, D_{N_{cbps}-1}$, the formula is defined as:

$$D_k = C_{(N_{cpc}/2) \cdot k \bmod L + \lfloor k/L \rfloor} L = 2N_{cbps}/N_{cpc}, k=0,1,\ldots,N_{cbps}-1$$

wherein $\lfloor\ \rfloor$ represents the flooring operation;
in said step (c2), each m=log 2(M) bits of said codeword bits $D_0, D_1, \ldots, D_{n_{cbps}-1}$ starting from $D_0$ form a group and are mapped to a modulation symbol, wherein M represents a modulation order.

8. A method of claim 1, wherein step (c) comprises the following steps:
if the encoded bit sequence before modulation is $D_0, D_1, \ldots, D_{N_{cbps}-1}$, and a complex symbol sequence after modulation is $S_0, S_1, \ldots, S_{N_{sym}-1}$, wherein $N_{cbps}$ is the number of codeword bits in a hybrid automatic repeat request sub-packet, and $N_{sym}$ is the number of complex symbols after the modulation of the hybrid automatic repeat request sub-packet, then the $k^{th}$ symbol $S_k$ in the complex symbol sequence corresponding to a binary sequence $(b_{m-1,k}, \ldots, b_{0,k})$, and $S_k$ comprising a real part $S_k^I$ and an imaginary part $S_k^Q$, wherein m=log 2(M), and M is a modulation order,
modulation orders for quadrature phase shift keying, 8 phase shift keying, 16 quadrature amplitude modulation and 64 quadrature amplitude modulation being respectively 2, 3, 4 and 6, then mapping the input binary data $D_0, D_1, \ldots, D_{N_{cbps}-1}$ for modulation to the constellation according to the following formulas:
if the modulation is quadrature phase shift keying:

$$(b_{1,k}, b_{0,k}) = (D_{2k}, D_{2k+1})\ k=0,1,\ldots,N_{cbps}/2-1$$

if the modulation is 8 phase shift keying:

$$(b_{2,k}, b_{1,k}, b_{0,k}) = (D_k, D_{k+N_{cbps}/3}, D_{k+2 \cdot N_{cbps}/3})\ k=0,1,\ldots N_{cbps}/3-1$$

if the modulation is 16 quadrature amplitude modulation:

$$(b_{3,k}, b_{2,k}, b_{1,k}, b_{0,k}) = (D_k, D_{k+N_{cbps}/4}, D_{k+N_{cbps}/2}, D_{k+3 \cdot N_{cbps}/4})\ k=0,1,\ldots N_{cbps}/4-1$$

if the modulation is 64 quadrature amplitude modulation:

$$(b_{5,k}, b_{4,k}, b_{3,k}, b_{2,k}, b_{1,k}, b_{0,k}) = (D_k, D_{k+N_{cbps}/6}, D_{k+N_{cbps}/3}, D_{k+N_{cbps}/2}, D_{k+2 \cdot N_{cbps}/3}, D_{k+5 \cdot N_{cbps}/6}).\ k=0,1,\ldots, N_{cbps}/6-1.$$

* * * * *